(12) United States Patent
Mattila et al.

(10) Patent No.: US 7,915,097 B2
(45) Date of Patent: Mar. 29, 2011

(54) ELECTRONIC MODULE WITH CONDUCTIVITY TRANSFORMATION REGION, METHOD OF MANUFACTURE AND APPLICATIONS THEREOF

(75) Inventors: Tomi Mattila, Espoo (FI); Ari Alastalo, Klaukkala (FI); Mark Allen, Espoo (FI); Heikki Seppä, Helsinki (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 180 days.

(21) Appl. No.: 12/155,671

(22) Filed: Jun. 6, 2008

(65) Prior Publication Data
US 2008/0303583 A1    Dec. 11, 2008

(30) Foreign Application Priority Data
Jun. 8, 2007    (FI) .................................... 20075429

(51) Int. Cl.
*H01L 21/20* (2006.01)
(52) U.S. Cl. ...... 438/141; 438/99; 438/102; 257/E21.05
(58) Field of Classification Search .................. 327/524; 438/141
See application file for complete search history.

(56) References Cited

U.S. PATENT DOCUMENTS

| | | | |
|---|---|---|---|
| 2004/0085797 A1 | 5/2004 | Mei et al. | |
| 2005/0129383 A1* | 6/2005 | Renn et al. | 385/147 |
| 2006/0159899 A1 | 7/2006 | Edwards et al. | |
| 2006/0163744 A1* | 7/2006 | Vanheusden et al. | 257/773 |
| 2007/0057311 A1 | 3/2007 | Leenders et al. | |

FOREIGN PATENT DOCUMENTS

| | | |
|---|---|---|
| FI | 20060697 A | 1/2008 |
| WO | WO-2005/104226 A2 | 11/2005 |
| WO | WO-2007/004033 A2 | 1/2007 |
| WO | WO-2008/009779 A1 | 1/2008 |

OTHER PUBLICATIONS

N. R. Bieri, et al., "Manufacturing of Nanoscale Thickness Gold Lines by Laser Curing of a Discretely Deposited Nanoparticle Suspension", Superlattices and Microstructures 35 (2004) 437-444, 2004.
J. Perelaer, et al., "Ink-jet Printing and Microwave Sintering of Conductive Silver Tracks", Advanced Materials, pp. 2101-2104, 2006.
S. Sivaramakrishnan, et al., "Controlled Insulator-to-Metal Transformation in Printable Polymer Composites With Nanometal Clusters", Nature Materials, vol. 6, pp. 149-155, Feb. 2007.

* cited by examiner

*Primary Examiner* — Ajay K Arora
(74) *Attorney, Agent, or Firm* — Birch, Stewart, Kolasch & Birch, LLP (57) ABSTRACT

This publication concerns electronics modules comprising at least one first material zone formed of first material which can be structurally transformed by means of electric interaction in order to increase its conductivity at least locally, the first material having a first transformation threshold, and at least one second material zone in the vicinity of the first material zone. According to the invention, the second material zone is formed from second material, which can also be structurally transformed in order to increase its conductivity, the second material having a second transformation threshold, which is lower than the transformation threshold of the first material zone. With the aid of the invention, post-processing electrical programmability and non-volatility of printable memories can be achieved.

18 Claims, 11 Drawing Sheets

ELECTRONIC MODULE WITH CONDUCTIVITY TRANSFORMATION REGION, METHOD OF MANUFACTURE AND APPLICATIONS THEREOF

FIELD OF THE INVENTION

The invention concerns electrical units, such as memory devices, in particular printable memories and the fabrication of same. The memories can be utilized, for example, in low-cost RFID, sensor, or media applications. The invention also relates to a method for manufacturing.

BACKGROUND OF THE INVENTION

Conductor structures can be created based on metallic nanoparticle suspensions printed on plastic or paper substrates and sintered at plastic/paper-compatible temperatures (T<200° C.). Such silver nanoinks are readily available from companies such as Cabot Inc. or Harima Inc. In addition to sintering at oven, laser [N. Bieri et al., Superlattices and Microstructures 35, 437 (2004).], UV and microwave [J. Perelaer et al., Adv. Mater. 18, 2101 (2006)] sintering is also known in prior art.

Patent Application FI 20060697, still unpublished when filing the present application, describes an improved method for sintering nanoparticle systems, electrical sintering. In that method, the nanoparticle system conductivity drastically improves under electrical treatment. In comparison with the conventional thermal sintering, the electrical sintering method is fast and reduces the thermal loading of the substrate and other surrounding structures. Electrical sintering enables direct online monitoring of the conductivity of the sintered lines and it enables patterning of the conductor structures during sintering. FI 20060697 also describes that the remaining resistance of the electrically sintered structure can be systematically controlled by the boundary conditions of the applied electric treatment (e.g. source impedance (bias resistor), dynamical source adjustment based on sintering process propagation, etc.).

S. Sivaramakrishnan, et al. suggest another method for controlled insulator-to-metal transformation in printable polymer composites with nanometal clusters in Nature Materials 6, 149 (2007). A similar method is disclosed in Patent Application Publication WO 2007/004033 A2.

US 2004/0085797 discloses a method for changing the state of nano- or microparticles by means of electric DC voltage. The voltage is applied by electrodes located on surfaces of a flexible, gel-like layer containing dispersed particles, whereby the particles orient aligned to the electric field or form clusters, the conductivity of the structure being locally increased. The method is not well suitable for producing non-volatile structures and cannot be used for forming conductor wires on surfaces.

WO 2005/104226 discloses a method for fabricating through-contacts in semiconductor chips by applying a very high (>1 kV) voltage burst through a nanoparticle-containing layer. The method cannot be used for forming conductor wires on surfaces.

US 2006/0159899 discloses a method for multi-layer printing of electronics and displays. In the method, electronic inks are deposited on a surface and the inks are cured. Deposition of a subsequent layer is carried only after a previous layer has been cured, i.e., brought into its final state. Thus, the method does not allow manufacturing of, for example, printed writable memories.

SUMMARY OF THE INVENTION

It is an aim of the invention to provide a novel electronics module, in particular a memory element, which can be conveniently manufactured and brought operational. In particular, it is an aim of the invention to provide a printable memory element, its intermediate product and a novel technique for bringing the memory element operational.

It is also an aim of the invention to provide a novel method for manufacturing the module and practical applications for the module.

The invention arises from the idea of using two materials that undergo a sintering process or the like at different conditions are used to construct a structure where the conductivity of a middle layer between two electrodes can be increased by electric interaction. In particular, nanoparticle materials having different sintering temperatures can be used for achieving such a structure. If the sintering temperature of the electrodes is chosen to be lower than the sintering temperature of the middle layer, the electrodes can be conveniently sintered without sintering the middle layer. The middle layer can thereafter serve as a write-once memory layer in memory elements, switches, anti-fuses and the like. The basic principle of the invention can be used in other fields of electrics also.

Thus, the electronics module according to the invention comprises at least one first material zone formed of first material which can be structurally transformed by means of electric interaction in order to increase its conductivity at least locally, the first material having a first transformation threshold, and at least one second material zone in the vicinity of the first material zone. According to the invention, the second material zone is formed from second material, which can also be structurally transformed in order to increase its conductivity, the second material having a second transformation threshold, which is lower than the transformation threshold of the first material zone.

The structural transformations can typically be initiated by increasing temperature by internal electrical interaction (electric sintering or the like processes) or by external thermal exposure. Preferably, the structural transformation of at least the first material is permanent by nature.

A memory element utilizing the abovementioned principle can be produced by forming a structure comprising two electrode layers and a memory layer, whereby the memory layer is formed of a first material which can be electrically transformed in order to increase the conductivity of the layer at least locally. Such material is preferably a nanoparticle-containing material. According to the invention, at least one, preferably both, of the electrode layers is manufactured from a second material, which can also be transformed in order to increase the conductivity of the electrode layer. The transformation thresholds, in particular transformation temperatures or electric field strengths, of the layers are chosen such that the transformation threshold (temperature/electric field) of the electrode layer is lower than the transformation threshold (temperature/electric field) of the memory layer. This allows for converting the memory element from an intermediate product into a functional memory element by subjecting the element to conditions lying between the characteristic transformation thresholds (temperatures/electric field) of the layers. When conventional sintering is utilized, the conditions comprise a suitable external temperature and/or pressure. On the other hand, when a material capable of being transformed by means of electric interaction, the desired condition is achieved by applying a suitable electric field to the structure (thereby internally, in a micro-scale, increasing the temperature of the electrodes above their transformation threshold).

Thus, the memory element comprises at least one memory zone (a memory bit) which has not been transformed at the time at least part of the electrode material is applied to the element. However, because the electrode material is easier to transform than the memory zone, it can be transformed afterwards without transforming the memory zone. Only at the time the memory is written is the memory zone transformed. This allows for more straightforward manufacturing of printable memory units, as the application of necessary materials and bringing the units operational can be done at completely different stages.

The resulting memory element or an intermediate product for the manufacture of a functional memory element comprises
  two electrode layers, and
  a memory layer manufactured from a first material being structurally transformable by means of an electric interaction in order to increase the conductivity of the layer at least locally.

The electrode layers and the memory layer and arranged in such relative position with each other that the structural transformation of the memory layer can be induced by applying a voltage between the electrode layers. According to the invention, at least one, preferably both of the electrode layers is manufactured from a second material, which is also structurally transformable in order to increase the conductivity of the layer at least locally and the transformation threshold of which is lower than the transformation threshold of the memory layer.

The layers can be situated vertically on top of each other as a sandwich structure or laterally as a planar structure. In a vertical arrangement, the structural transformation of the middle layer when writing to the element proceeds mainly in a direction perpendicular to the substrate. In lateral arrangement, the transformation proceeds mainly in a direction defined by the plane of the substrate.

Multiple memory units of the above kind may be arranged in an array for forming an element having an increased storage capacity. Thus, the structure comprises a plurality of memory units in the form of a one-, two- or three-dimensional grid, whereby the electrode layers are arranged for allowing writing and reading of each of the memory units individually.

More specifically, the method, electronics module, printed electronics product, a sensor and RFID tag according to the invention are characterized by what is stated in the independent claims.

According to a preferred embodiment of the invention, there is provided a method for forming a memory element, the method comprising forming a structure comprising outer electrode layers and a middle memory layer, so that at least one of the outer layers comprises nanoparticles, which can be sintered in order to increase the conductivity of said at least one outer layer, the sintering temperature of said at least one outer layer being lower than the sintering temperature of the middle layer.

The present invention offers significant benefits. By means of the invention, structures can be manufactured and functionalized, which comprise two or more zones of material to be applied in close vicinity of each other, but only one of them is desired to be transformed by sintering, for example.

Particular benefits are gained in the field of printable memories. That is, the structure can operate, for example, as a write-once-read-many (WORM) device. There exists a general need for low-cost digital memories in many applications such as in RFID, sensor and media applications of printed electronics, which is a market for which strong growth is expected, for example, by IDTechEx. The present invention allows for post-processing, electrical programmability, low-voltage operation, and non-volatility, which are all desirable memory properties in the above-mentioned fields. The type of the needed memory, Random Access Memory (RAM), ROM, or WORM, on the other hand, depends on the application.

Another advantage of the present invention is that the memory writing can be done after actual device manufacturing process. This is a clear benefit e.g. over the printed devices described in US Patent Application Publication US 2007/0057311 where each bit is created during printing. Also many other conventional printed memories are ROM-type (Read Only Memory), that is, written at the time of manufacturing.

In low-cost applications, memory fabrication is normally targeted to be done with printing that is potentially a very advantageous method for low-cost, large volume production.

The products in the major application areas of the invention are typically passive or battery-powered and thus it is important for their memories to be read and written at low voltage levels. As the vertical topology of the device according to a preferred embodiment of the invention can be designed such that low operational voltages are allowed, the present invention provides a convenient solution to that problem too.

Nanoparticles, in particular encapsulated metallic nanoparticles have been observed to be particularly advantageous as concerns the low sintering voltage and non-volatility of the memory. Suitable metals are particularly silver, gold, copper, platinum, nickel, palladium, iron, titanium, tin, and alloys of these.

Additional advantages are gained by further embodiments of the invention, some of which are characterized in the dependent claims.

According to one embodiment, materials are used that allow the structural transformations to be initiated by increasing temperature by internal electrical interaction or by external thermal exposure.

According to one embodiment, first and/or second material is used that has the property that the structural transformation of the first and/or second material is permanent by nature (such as a memory layer in WORM memory).

According to one embodiment, nanoparticle-containing material, preferably containing encapsulated nanoparticles and typically having a metallic core, is used as the first and/or second material.

According to one embodiment, the electrics module is a memory element obtained by manufacturing a structure comprising one or more memory units each comprising two electrode layers and a memory layer, whereby the memory layer is formed of said first material and at least one of the electrode layers is formed of said second material. Typically, at least one of the electrode layers is transformed at conditions above the transformation threshold of the electrode layer but below the transformation threshold of the memory layer, preferably by a thermal sintering method or by applying a suitable electric transformation field or voltage through the at least one electrode layer, preferably perpendicular to the plane of the layer. Each of the memory units preferably forms a sandwich structure, where the memory layer is applied between outer electrode layers.

One or all of the layers of the structure are typically formed by printing or by aerosol-deposition on a substrate. As the substrate, paper, cardboard or plastic is preferably used.

According to a preferred embodiment, the layers are brought to the substrate as nanoparticle-containing inks, which are dried after application.

The nanoparticles in one or all of the layers of the structure are preferably encapsulated for allowing easy deposition and sintering.

When making the memory product ready for use, at least one outer layer is sintered at a temperature lower than the sintering temperature of the middle layer by a conventional thermal sintering method (e.g., oven, laser, UV or microwave) or by applying a suitable electric sintering field or voltage over the at least one outer layer, preferably perpendicular to the plane of the layer.

The structure is preferably a sandwich structure which is realized by
   printing a first electrode pattern on a substrate and letting the electrode pattern dry,
   printing a middle layer on the dried first electrode pattern and partially overlapping with the first electrode pattern and letting the middle layer dry, and
   printing a second electrode pattern on the dried middle layer and partially overlapping with the middle layer and let the second electrode pattern dry.

A plurality of such sandwich structures can be created in the form of a one-, two- or three-dimensional grid, whereby at least one or both of the outer layers are provided in the form of continuous strips which intersect a strip or strips formed by the other outer layer such that at least at the intersection areas the middle layer remains between the outer layers.

An additional insulating material layer can be applied to the sandwich structure in order to keep the electrode layers in electric isolation before sintering the middle layer.

The structure can also be a planar structure which is realized by printing the first and second electrode patterns on a substrate spaced from each other, and printing the middle layer between the first and second electrode patterns.

According to a second aspect of the invention the first and second electrode layers are formed from nanoparticle-containing layers having a sintering temperature lower than the sintering temperature of the middle layer. The layers are applied on a paper, cardboard or plastic substrate. The layers form a sandwich structure, as described above in more detail. Further, the structure may comprise a plurality of such sandwich structures in the form of a one-, two- or three-dimensional grid, whereby at least one or both of the outer layers are in the form of continuous strips which intersect a strip or strips formed by the other outer layer such that at least at the intersection areas the middle layer remains between the outer layers.

The layers can be applied laterally in order to form a planar structure. Thus, the first and second electrode layers are printed on the substrate spaced from each other and the memory layer is printed between the first and second electrode layers.

In a memory application the first and second electrode layers have been sintered by increasing their temperature to a temperature lower than the sintering temperature of the middle layer by a conventional thermal sintering method or by electrical sintering.

According to a third aspect of the invention there is provided a printed electronic product comprising a memory element or an intermediate product for the manufacture of a functional memory element.

According to a fourth aspect of the invention there is provided a sensor device comprising a sensor coupled to a memory element or an intermediate product for the manufacture of a functional memory element for storing data provided by the sensor.

When describing the embodiments, the term "electrical sintering" is frequently used to describe the structural transformation process taking place in the nanoparticle-containing layer. It is to be noted, that the term "electrical sintering" in this text has a general meaning: In addition to conventional scope of nanoparticles being adhered to each other during sintering process, the "electrical sintering" transformation may also include (i) extended electrical exposure leading to a complete melting and recrystallization during which the original nanoparticle array form disappears, (ii) electro-thermal avalanche or breakthrough type phenomena leading to a formation of local wire-like structures. Specifically, it should also be noted that the electrically induced transformation may not encompass the entire middle layer, but induced conduction path(s) may be of local character.

DETAILED DESCRIPTION OF THE EMBODIMENTS

Figure 1A:
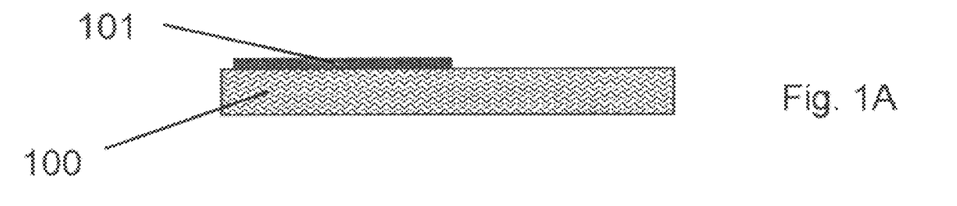
FIGS. 1A-1D show in a side view of a memory bit fabrication sequence in a vertical topology, the final structure and the memory programming, according to one preferred embodiment of the invention.
Figure 1B:
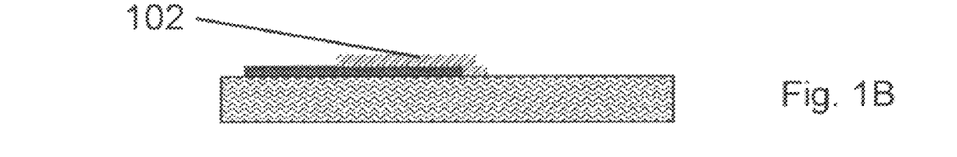
Figure 1C:
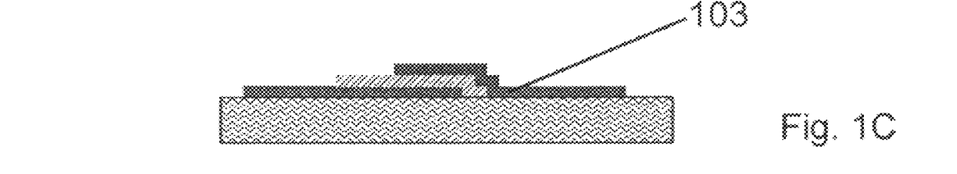
Figure 1D:
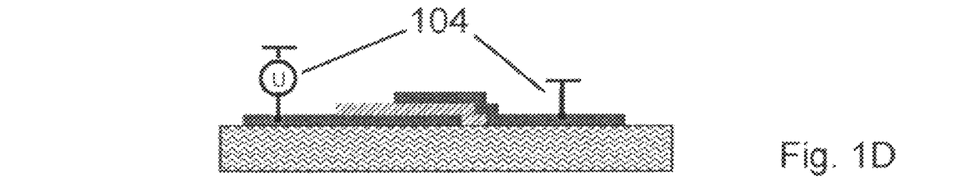
Figure 2A:
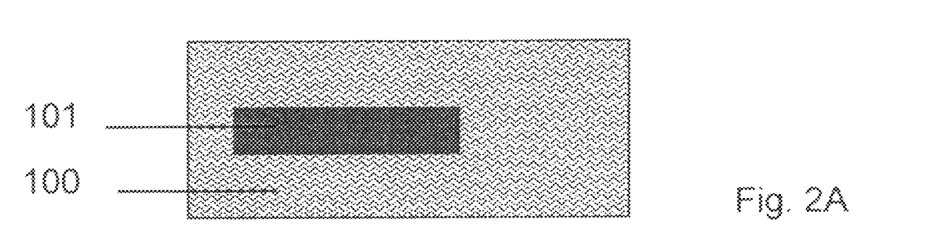
FIGS. 2A-2C show in a top view the memory bit fabrication sequence of FIG. 1 in the vertical topology and the final structure.
Figure 2B:
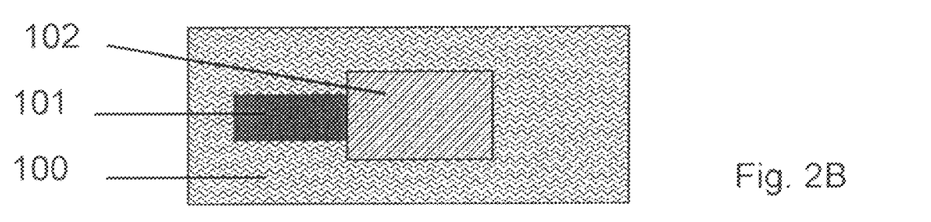
Figure 2C:
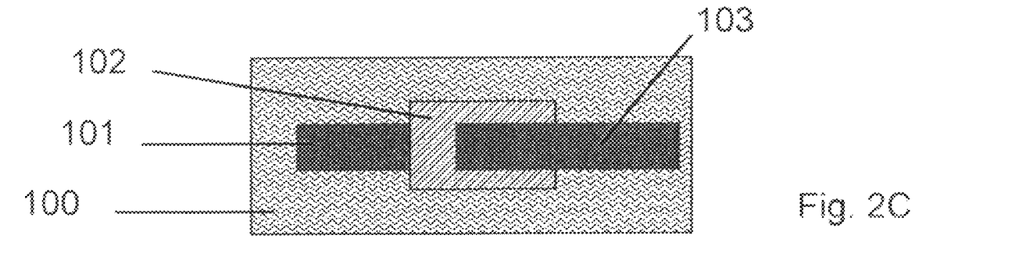

FIGS. 1 and 2 describe one preferred embodiment of the invention. Here, a vertical parallel-plate three-layer structure is realized that serves as a write-once-read-many (WORM) memory element. The fabrication and operation procedure essentially consist of steps (A) ... (D) illustrated in FIG. 1. A key property of the structure is that it is made of two nanoparticle inks N1 and N2 that sinter at temperatures $T_{cure1} < T_{cure2}$, respectively. The first electrode 101 is first printed of material N1 on the substrate 100 [FIG. 1A] and dried so that further deposition becomes possible. The middle layer 102 is then printed of material N2 and dried for allowing further deposition [FIG. 1B]. The second electrode 103 is then printed of material N1 and dried [FIG. 1C]. At this point, the entire structure is ready to be sintered at temperature $T_{cure1} < T < T_{cure2}$, so that the two electrodes 101, 103 become sintered and well-conducting while the middle layer 102 remains unsintered. Such nanoparticle inks showing substantially differing sintering temperatures are already commercially available. The programming of the memory bit [FIG. 1D] is done by using "electrical sintering": an electrical voltage 104 is applied over the middle layer which becomes (at least partially) sintered and shows increased conductivity. The device operates thus as a write-once-read-many (WORM) memory. Possible applications of such device include data recording in sensor applications: for example, one could realize a printed moisture sensor that monitors the package humidity and at programmed intervals/limit-crossings writes data into the memory.

FIG. 2 illustrates the top view of the fabrication sequence described in FIG. 1 and in the text above.

A key advantage of the vertical topology illustrated in FIG. 1 is that the small thickness of the layer 102 to be electrically sintered allows the writing at low operational voltages/power.

Furthermore, the layer thickness is generally a well controllable parameter as is well known in the field of thin-film technology.

We have observed in our experiments that unsintered layers can remain electrically sinterable for sufficient durations (months, years) for practical applications.

It is obvious that optionally the first layer 101 and the second layer 102 can be directly cured at temperature $T_{cure1} < T < T_{cure2}$ after deposition, instead of only being dried and later cured.

Figure 3:
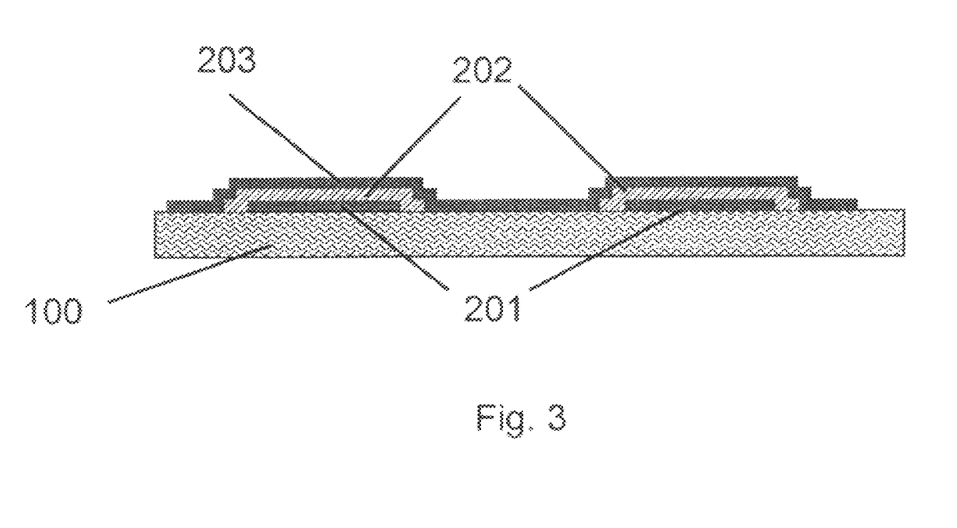
FIG. 3 illustrates in a side view a two dimensional memory matrix according to an embodiment of the invention.
Figure 4:
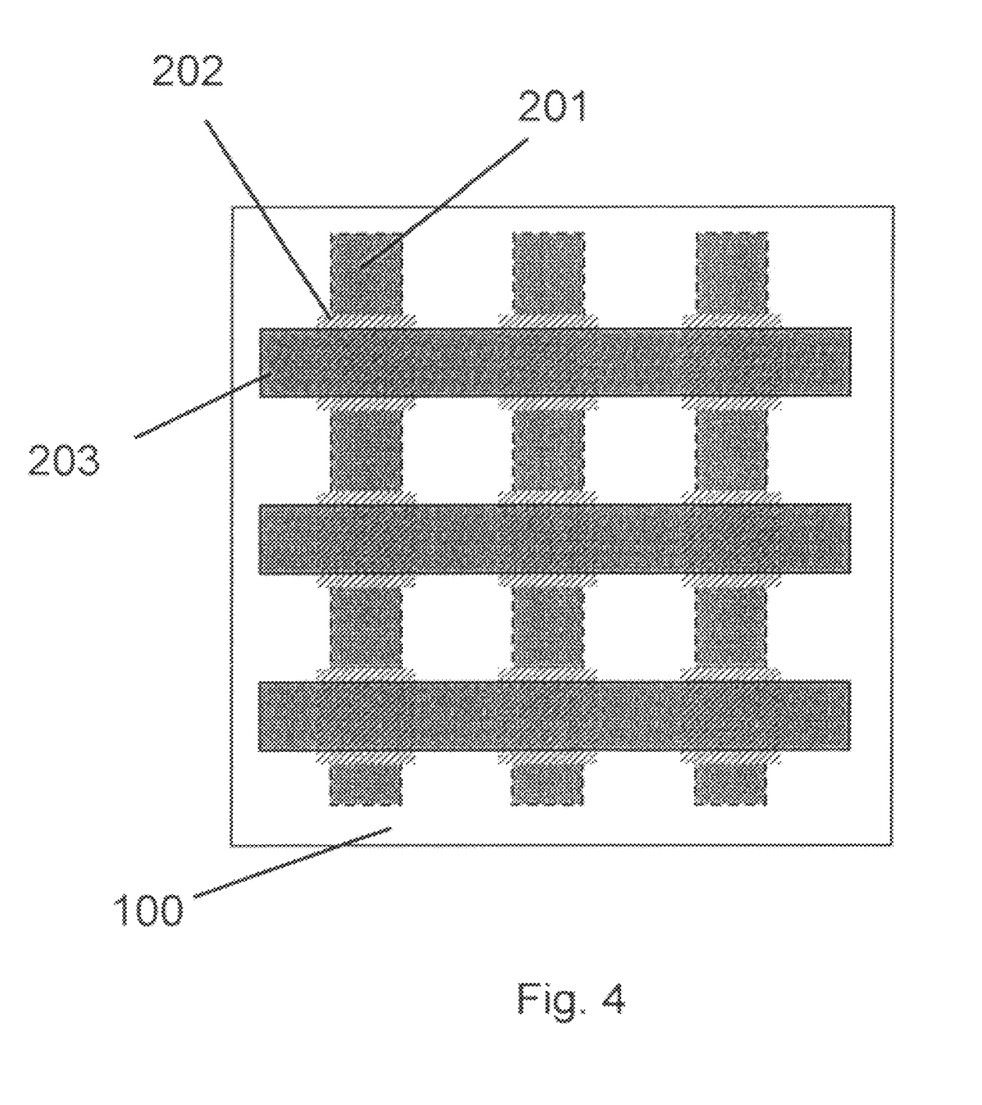
FIG. 4 shows in a top view a two dimensional memory matrix of FIG. 3.

FIGS. 3, 4, 5 and 6 illustrate another set of preferred embodiments of the invention for realization of a two-dimensional memory array. FIGS. 3 and 4 describe the structure where the first electrodes 201 (say, "bit lines") are first printed on the substrate 100, followed by the deposition of the middle memory layer 202 and the deposition of the second 203 electrodes (say, "word lines"). As is evident from FIG. 4, the deposition of the memory layer 202 can be deposited at the electrode intersection locations.

Figure 5:
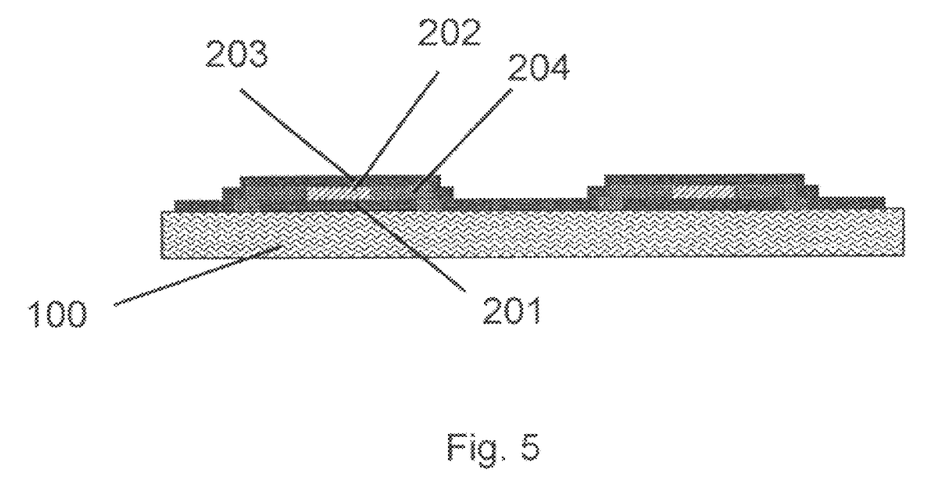
FIG. 5 shows in a side view a two dimensional memory matrix including an additional insulating layer.
Figure 6:
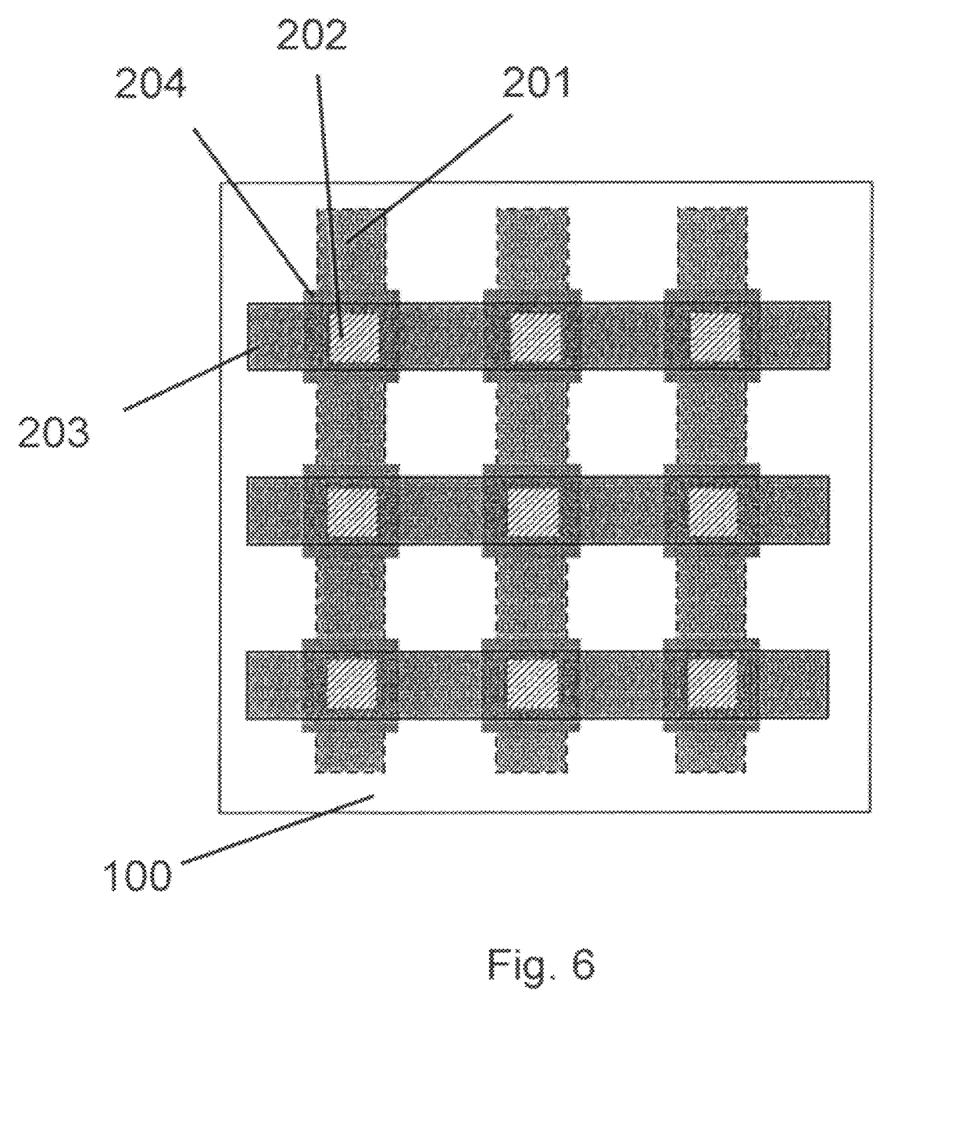
FIG. 6 depicts in a top view a two dimensional memory matrix of FIG. 5.

As shown in FIGS. 5 and 6, an additional insulator layer 204 may be utilized in the structure, for example, to assist in solving step coverage issues. Also, the memory layer area 202 can be conveniently controlled by utilizing the insulator layer 204, for example, to tailor the impedance range of the memory bit or to reduce the memory layer 202 material consumption.

Figures 7A, 7B, 7C:
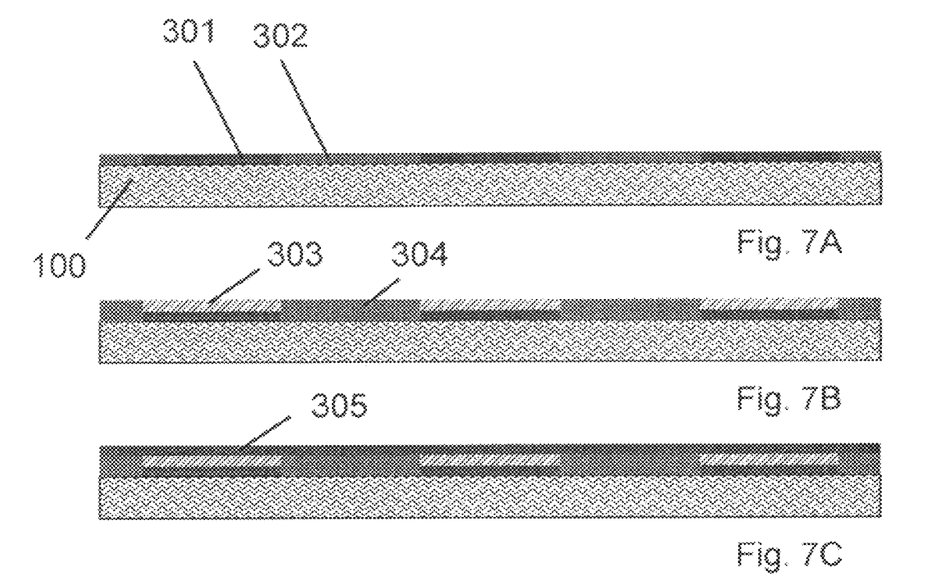
FIGS. 7A-7D show in a side view a three dimensional memory matrix fabrication sequence and the final structure according to a preferred embodiment of the invention.
Figure 7D:
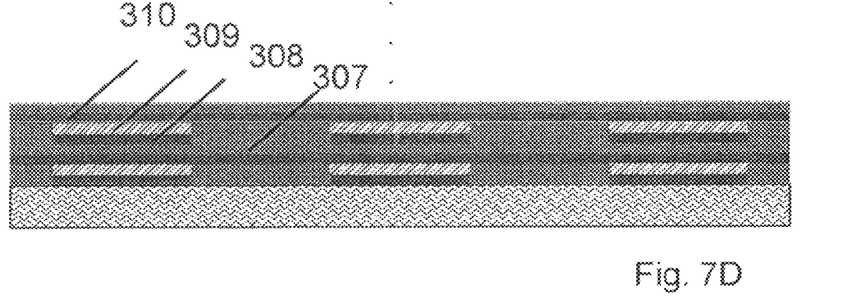
Figure 8:
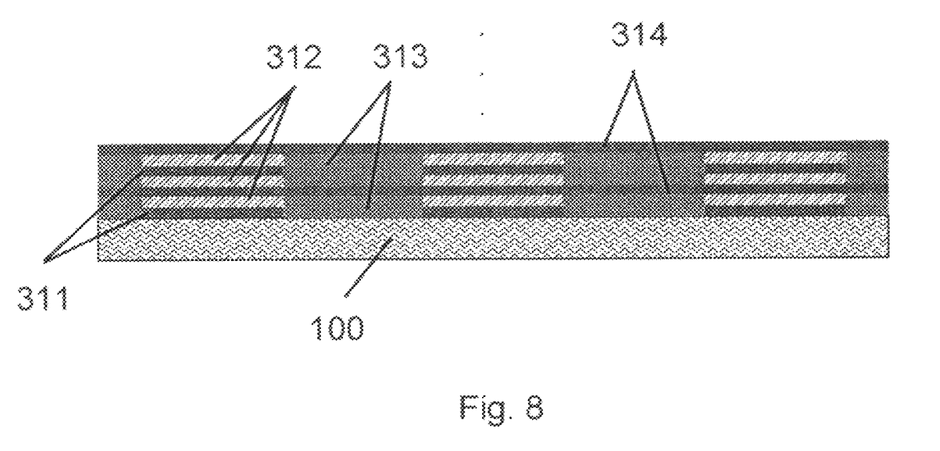
FIG. 8 shows a side view of a three dimensional memory matrix structure utilizing an alternative electrode arrangement.
Figure 9:
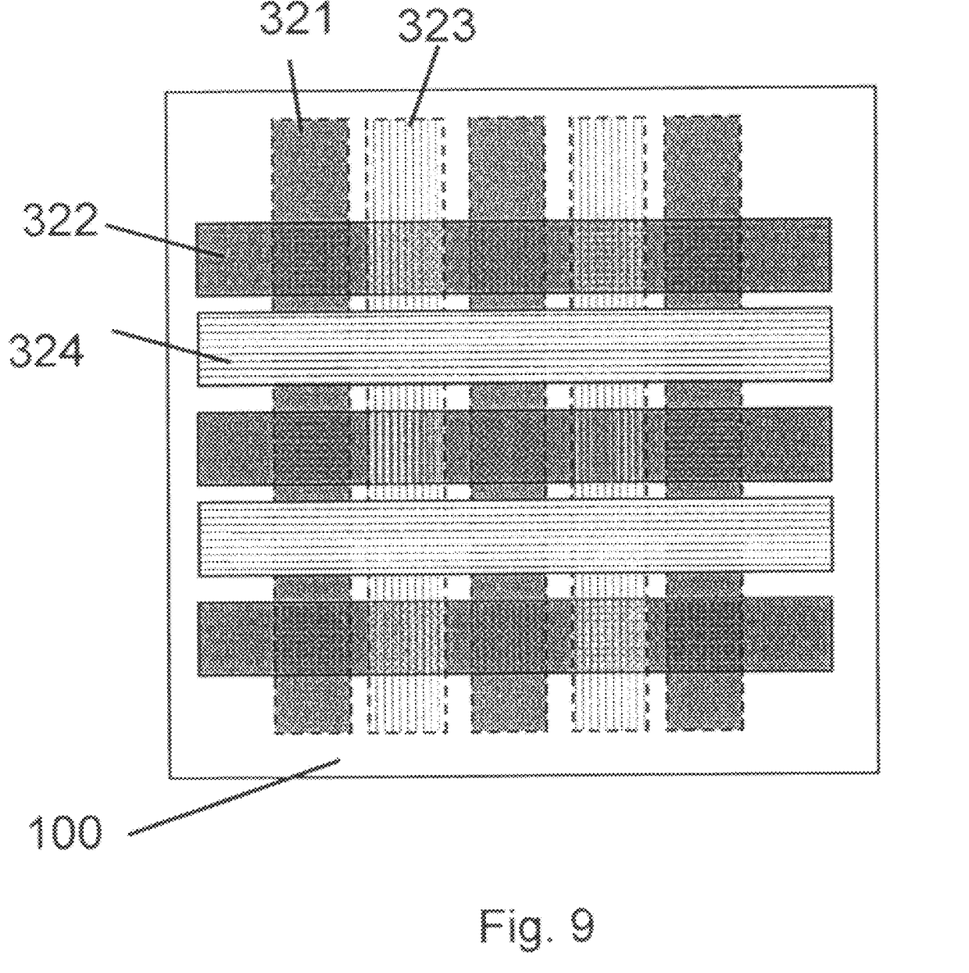
FIG. 9 depicts a top view of the three dimensional memory matrix structure of FIG. 8.

FIGS. 7, 8 and 9 illustrate a set of further preferred embodiments for realization of a three-dimensional (3D) memory structure. It should be noted that the possibility of the vertical stacking via successive deposition of multiple layers is a general advantage of the printing methods, and includes the potential for realizing high-density memory devices (bits/volume, small occupied area, high density despite the linewidth restrictions in printing techniques). FIG. 7 illustrates the basic preferred 3D memory structure and its realization sequence. First, the first electrodes 301 and the first insulator areas 302 are deposited on the substrate 100 [FIG. 7A]. Then, the memory layer 303 and another insulator layer 304 are deposited [FIG. 7 B], followed by the deposition of the second electrodes 305 [FIG. 7 C]. At this point, the first layer of memory cells has been created. The 3D realization sequence can be then continued [FIG. 7 D] by depositing an insulator layer 307, and a second layer of memory cells containing similarly e.g. the first electrodes 308, the memory layer 309 and the second electrodes 310. The realization sequence can then be further continued by similar repetition of the first two memory layers described above, until the desired memory size is achieved [FIG. 7D].

FIG. 8 illustrates (side view) another preferred embodiment for the realization of the 3D memory structure. Here, the memory density is improved in comparison with FIG. 7 by essentially utilizing each electrode to access a memory layer on top and below the electrode. FIG. 8 illustrates the first electrodes 311, the memory layers 312, the insulator layers 313 and the second electrodes 314.

FIG. 9 illustrates (top view) how the x- and y-electrodes ("bit" and "word" lines, respectively) can be arranged in alternating positions. Here, the first set of y-lines 321, the first set of x-lines 322, the second set of y-lines 323, and the second set of x-lines 324 are successively deposited (including the intermediated memory and insulating layers, not shown in FIG. 9). The fabrication sequence can then be continued by depositing the third set of y-lines at the location (on top) of the first set of y-lines 321 and so on. Using the alternating configuration of y- and x-lines, it is possible to obtain advantages such as (i) higher memory density (thinner structure), (ii) flatter structure assisting e.g. in step-coverage.

Figure 10A:
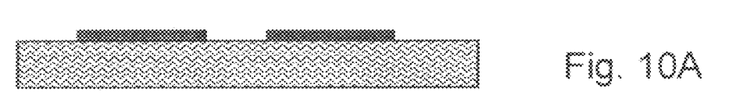
FIGS. 10A-10C show in side views a fabrication sequence of a lateral topology manufacturing method and structure according to one embodiment of the invention.
Figure 10B:
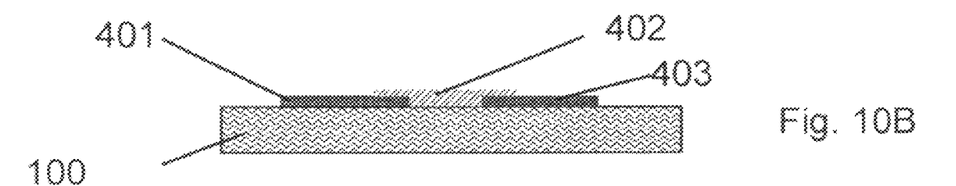
Figure 10C:
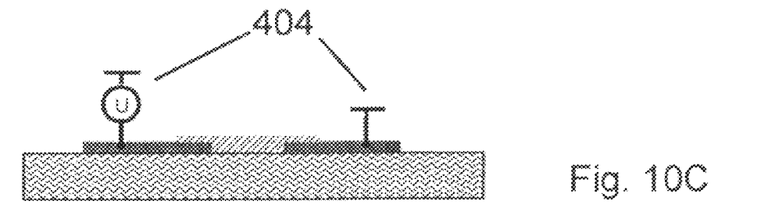
Figure 11:
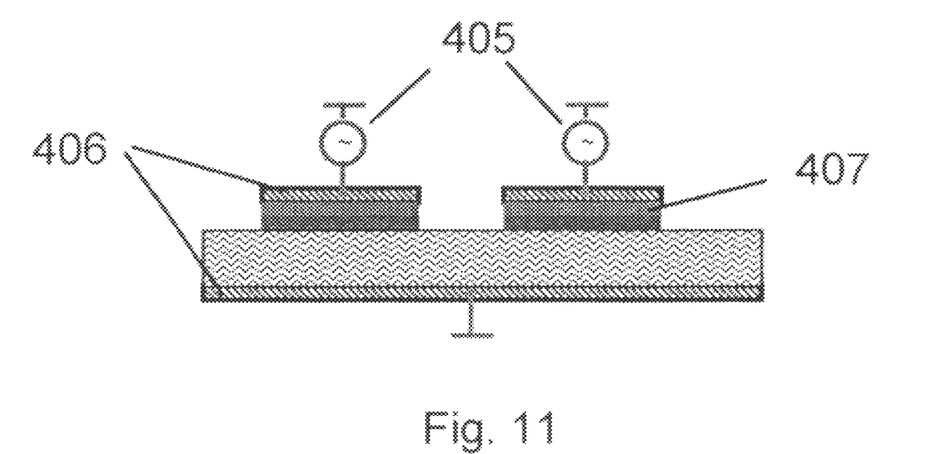
FIG. 11 shows an exemplary arrangement for electric sintering of the electrodes.
Figure 12:
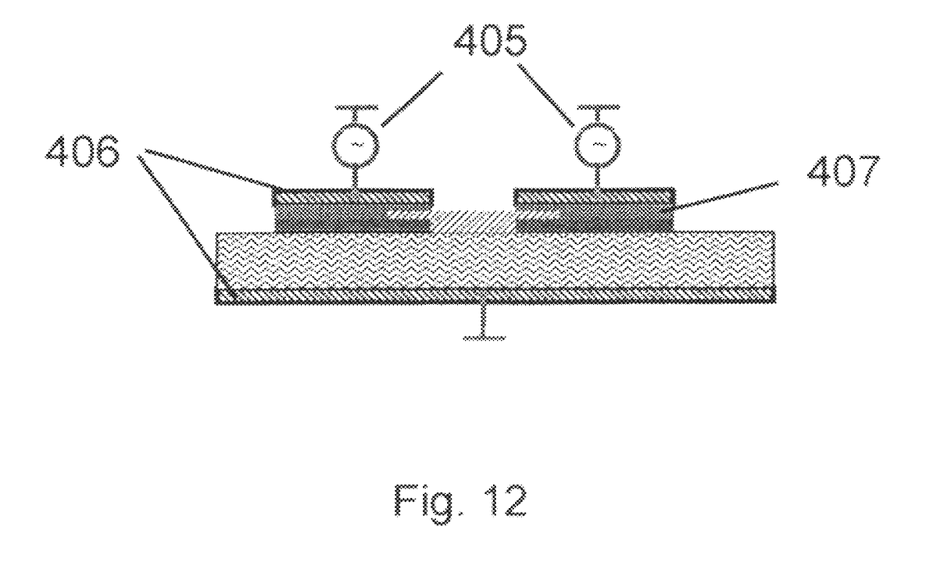
FIG. 12 shows an alternative arrangement for electric sintering of the electrodes.

FIGS. 10, 11 and 12 show a set of other preferred embodiments where a lateral device topology is employed. Here, the first 401 and the second 403 electrodes are printed first on the substrate 100 [FIG. 10A] and the memory layer 402 second [FIG. 10B]. As described above, by using the materials with differing sintering temperature for the electrodes 401,403 and the memory layer 402, the entire structure can be finally sintered at temperature $T_{cure1} < T < T_{cure2}$, that sinters the electrodes but leaves the memory layer unsintered. The memory structure is later writable using electrical sintering using an applied voltage 404 [FIG. 10C]).

Optionally, as shown in FIG. 11 and FIG. 12, also electric, instead of thermal, sintering can be used for the sintering of the electrodes in the horizontal memory structure. This can be done after printing the electrodes (before application of the memory layer) [FIG. 11] or after printing of both layers [FIG. 12] when the electric sintering intensity is selected so that the higher sintering temperature of the memory layer leaves it unsintered while the electrodes become sintered. In FIGS. 11 and 12 the electrical sintering method includes sintering electrodes 406 applied on top and below the structure to be sintered, the power source and electrical connections 405 and an optional insulator layer 407. Typically, an AC voltage is applied to induce electrical sintering of the electrodes 401, 403. The insulator layer 407 and the sintering electrodes 406 can be external, i.e., do not remain part of the fabricated structure.

Obviously, electric sintering can be similarly used for sintering of at least one of the electrodes in the vertical topology (FIGS. 1 . . . 9) as well.

As is evident in FIG. 10, the central disadvantage of the lateral topology is the high printing resolution/accuracy needed for realization of sufficiently electrical sintering length. This emphasizes the advantages of the vertical topology in FIG. 1.

For allowing writing to the memory, the device contains or is coupled to means for applying electrical sintering voltage between the electrode layers. When the voltage is applied, the state of the memory layer changes.

It has been observed in experiments, that the resistance of the electrically sintered material can be systematically controlled by varying the electrical exposure (for example, by using a bias resistor in series or by using a programmable power source where the applied voltage and current pattern can be controlled). It is therefore possible to write each memory cell several times, each time the obtained resistance becoming lower. This allows (i) multivalue/multibit storage at each cell, (ii) partial rewritability of each cell. That is, means for applying the writing voltage may be adapted to cause the conductivity of the memory layer to increase stepwise in a controlled manner so as to achieve a memory element where each of the memory units may have three or more predefined conductivity states for increasing the capacity of the device.

Furthermore, for additional rewritability one can construct an emulated RAM with a limited number of writing cycles N); for example, a structure which contains N times M bits where M is the memory storage (block) size. At a time of writing/rewriting, a new block of M bits is used. Additionally, the structure contains a pointer memory area of similar memory cells which is updated at each writing and directs the read and next write access to the desired memory block.

It is obvious to the person skilled in the art that (i) there exist additional embodiments which can be realized utilizing three or more materials with differing sintering temperatures $T_{cure1}, T_{cure2}, T_{cure3}, \ldots$, (ii) the materials are not restricted to metal nanoparticles but other materials may be employed as well (e.g. ITO, doped ZnO, etc), (iii) the printing methods are not restricted to ink-based methods (liquid suspensions) but e.g. aerosol-deposition techniques [for example, see the M3D deposition process by www.optomec.com] may be employed as well.

The invention claimed is:

1. A method for forming an electrics module, the method comprising forming to the module a structure comprising at least one first material zone and at least one second material zone in the vicinity of the first material zone, the first material zone being formed of a first material which can be structurally transformed by means of electric interaction in order to increase its conductivity at least locally, the first material having a first transformation threshold, the method further comprising using a second material zone formed from a second material, which can be structurally transformed in order to increase its conductivity, the second material having a second transformation threshold being lower than the transformation threshold of the first material zone, and forming a structure comprising one or more memory units each unit comprising two electrode layers and a memory layer, whereby the memory layer is formed of said first material and at least one of the electrode layers is formed of said second material.

2. A method according to claim 1, wherein said structural transformations can be initiated by increasing temperature by internal electrical interaction or by external thermal exposure.

3. A method according to claim 1, wherein said structural transformation of at least the first material is permanent by nature.

4. A method according to claim 1, wherein nanoparticle-containing material is used as the first and/or second material, the first and/or second material preferably containing encapsulated nanoparticles, typically having a metallic core.

5. A method according to claim 1, wherein the electrics module is a memory element, and said two electrode layers and memory layer for at least one of said memory units are in the form of a sandwich structure.

6. A method according to claim 5, wherein the at least one of the electrode layers is transformed at conditions above the transformation threshold of the electrode layer but below the transformation threshold of the memory layer, preferably by a thermal sintering method or by applying a suitable electric transformation field or voltage through the at least one electrode layer, preferably perpendicular to the plane of the layer.

7. A method according to claim 5 or 6, the method further comprising forming a plurality of sandwich structures in the form of a one-, two- or three-dimensional grid, whereby at least one or both of the outer layers are provided in the form of continuous strips which intersect a strip or strips formed by the other outer layer such that at least at the intersection areas the memory layer remains between the outer layers.

8. A method according to claim 5, the method further comprising printing a first electrode layer on a substrate and letting the electrode layer dry, printing a memory layer on the dried first electrode layer and partially overlapping with the first electrode layer and letting the memory layer dry, and printing a second electrode layer on the dried memory layer and partially overlapping with the memory layer and letting the second electrode layer dry.

9. A method according to claim 5 or 6, wherein said structure is a planar structure, the memory layer and electrode layers being situated laterally with respect to each other on a substrate.

10. An electronics module comprising at least one first material zone formed of a first material which can be structurally transformed by means of electric interaction in order to increase its conductivity at least locally, the first material having a first transformation threshold, at least one second material zone in the vicinity of the first material zone, wherein the second material zone is formed from a second material, which can also be structurally transformed in order to increase its conductivity, the second material having a second transformation threshold, which is lower than the transformation threshold of the first material zone, one or more memory units, each of the units further comprising two electrode layers manufactured from said second material, and a memory layer manufactured from said first material.

11. An electronics module according to claim 10, wherein the first and/or second material contains nanoparticles, preferably in encapsulated form, prior to transformation.

12. An electronics module according to claim 10, wherein said module is a memory element, such as a WORM element, or an intermediate product for the manufacture of a functional memory element, and whereby the electrode layers and the memory layer are arranged in sandwich configuration or other such relative position with each other that the structural transformation of the memory layer can be induced by applying a voltage between the electrode layers.

13. An electronics module according to claim 12, wherein said module comprises a control unit adapted to group the memory units of the memory element into memory blocks and memory block pointer units for achieving a random access memory (RAM) type element having a limited number of possible write accesses.

14. An electronics module according to claim 12, wherein said module it comprises a plurality of such sandwich structures in the form of a one-, two- or three-dimensional grid, whereby at least one or both of the outer layers are in the form of continuous strips which intersect a strip or strips formed by the other outer layer such that at least at the intersection areas the middle layer remains between the outer layers.

15. An electronics module according to claim 12, wherein said module it is a memory element wherein at least one of the electrode layers, typically both, is at least locally in a structurally transformed state, in which the conductivity of the layer is higher than the conductivity of an untransformed layer.

16. A printed electronics product comprising an electronics module according to claim 10.

17. A sensor device comprising a sensor coupled to a memory element or an intermediate product for the manufacture of a functional memory element according to claim 12 for storing data provided by the sensor.

18. An RFID tag comprising a memory element or an intermediate product for the manufacture of a functional memory element according to claim 12.

* * * * *